(12) United States Patent
Wellig

(10) Patent No.: US 7,916,818 B2
(45) Date of Patent: Mar. 29, 2011

(54) METHOD AND DEVICE FOR ESTIMATING THE RELATIVE DRIFT BETWEEN TWO CLOCKS, IN PARTICULAR FOR RANGING APPLICATIONS IN UWB-LDR TECHNOLOGY

(75) Inventor: Armin Wellig, Sartigny (CH)

(73) Assignee: STMicroelectronics N.V., Amsterdam (NL)

( * ) Notice: Subject to any disclaimer, the term of this patent is extended or adjusted under 35 U.S.C. 154(b) by 798 days.

(21) Appl. No.: 11/850,934

(22) Filed: Sep. 6, 2007

(65) Prior Publication Data
US 2008/0069260 A1    Mar. 20, 2008

(30) Foreign Application Priority Data
Sep. 19, 2006 (EP) .................................. 06019591

(51) Int. Cl.
*H04L 7/00* (2006.01)
(52) U.S. Cl. ..................... 375/354; 375/265; 375/341
(58) Field of Classification Search .................. 375/233, 375/265, 341, 354; 714/794, 795, 798
See application file for complete search history.

(56) References Cited

U.S. PATENT DOCUMENTS

| | | | | |
|---|---|---|---|---|
| 5,563,888 A * | 10/1996 | Parr et al. | ...................... | 370/516 |
| 6,408,420 B1 * | 6/2002 | Todoroki | ...................... | 714/795 |
| 6,532,567 B2 * | 3/2003 | Ino | ................................. | 714/798 |
| 2004/0101040 A1 * | 5/2004 | Agazzi | ........................... | 375/233 |
| 2004/0133843 A1 * | 7/2004 | Yamakawa | .................... | 714/794 |
| 2004/0202203 A1 | 10/2004 | Kolze et al. | .................. | 370/503 |

* cited by examiner

*Primary Examiner* — Shuwang Liu
*Assistant Examiner* — David Huang
(74) *Attorney, Agent, or Firm* — Lisa K. Jorgenson; Allen, Dyer, Doppelt, Milbrath & Gilchrist, P.A.

(57) ABSTRACT

A method is for estimating drift between a first clock used in a digital transmission processing of a first Ultra Wide Band (UWB) pulse train signal and a second clock used in a digital reception processing of a second UWB pulse train signal resulting from a transmission of the first UWB pulse train signal. The method may include sampling the second UWB pulse train signal, and calculating trellis information representative of a trellis having reference paths respectively associated to different reference values of the drift and including sample transitions of a sampled third signal from the sampled second UWB pulse train signal. The method may further include processing the sampled third signal along the trellis for obtaining a path metric for each processed reference path, and selecting the processed reference path having a greatest path metric, the drift being the reference value associated to the selected processed reference path.

22 Claims, 17 Drawing Sheets

METHOD AND DEVICE FOR ESTIMATING THE RELATIVE DRIFT BETWEEN TWO CLOCKS, IN PARTICULAR FOR RANGING APPLICATIONS IN UWB-LDR TECHNOLOGY

FIELD OF THE INVENTION

The invention relates to the Ultra Wide Band impulse radio technology, more particularly, Ultra Wide Band for Low Data Rate (LDR) applications and the estimation of values of an eventual relative drift between two clocks respectively clocking two UWB pulse train signals.

BACKGROUND OF THE INVENTION

Ultra Wide Band (UWB) radio technology may differ from conventional narrow band radio and spread-spectrum technologies in that the bandwidth of the signal is greater, for example, the bandwidth being at least 500 MHz wide or the bandwidth of the signal at −10 dB being 20% greater than the center frequency bandwidth. Further, in UWB pulsed technology, instead of transmitting a continuous carrier wave modulated with information or with information combined with a spreading code, which determines the bandwidth of the signal, a UWB pulsed signal comprises a series of narrow pulses, typically, less than or around 2 ns in duration. These short time-domain pulses, when transformed into the frequency domain, result in the ultra-wide band spectrum of UWB radio (also called UWB impulse radio).

In UWB, the information carried by the pulsed signal can be coded, for example, by using a pulse position modulation. In other words, the information coding is performed by modifying the emission time instant of the individual pulses. More precisely, each pulse is transmitted in a window having a predetermined duration, called "pulse repetition period" (PRP). The transmitted pulse is thus before or behind a reference emission position, which permits encoding a "zero" (0) or a "one" (1). It is also possible to encode more than two values by using more than two positions shifted with respect to the reference position, and to superimpose a BPSK modulation on this position modulation.

UWB impulse radio has been approved by the IEEE 802.15.4a standardization body as a radio technology suitable to enable low-cost and low-power devices for LDR applications within ad hoc sensor networks. Besides interference mitigation and network co-existence enhancements, one of the key drivers for the development of an alternative LDR physical layer over the existing ZigBee/IEEE-802.15.4 approach is to provide the protocol and radio support for accurate ranging and localization applications. Compared to the narrowband carrier modulation system, the impulse-based UWB-LDR occupies a large bandwidth, i.e. roughly 500 MHz, which directly translates into high multipath resolvability. Thus, it may be well suited for accurate ranging by estimating the Time-of-Flight (ToF) of the transmitted signal.

Since ad hoc sensor networks are typically comprised of many asynchronous devices with no common reference clock, a time-multiplexed half-duplex ranging protocol between two distant nodes has been provided in the IEEE 802.15.4a standard to provide accurate ranging through ToF measurements.

Since the ToF is only a fraction of a microsecond, the error that may be caused by the quartz crystal inaccuracies—which is expected to be as large as ±40 ppm for low-cost devices—is the relative crystal drift. The standard defines two ways to manage this relative crystal (or clock) drift, referred to as implicit and explicit ranging modes. The explicit ranging mode uses the receiving node to estimate the relative drift and to report it back to the transmission node.

At present, the IEEE 802.15.4a standard appears to give no indication on how to implement such a relative drift estimation. However, every standard-compliant apparatus may have to implement a crystal (or clock) drift estimation. Whereas the clock drift is an important question for ranging applications in UWB-LDR systems, such a clock drift is generally more a problem in UWB systems because it can lead to a synchronization loss during communication.

In narrowband systems, non-coherent delay lock loop (DLL) designs have been used extensively to ensure accurate synchronization based on Early-Late Gate Synchronizer (ELGS) circuits. ELGS circuits exploit the symmetry property of the correlation function or the matched filtering between the received signal waveform and its replica. The ELGS monitors two equally spaced sampling points, where one sampling instant is running late and the other one is running early with respect to the eligible "on time" sampling point, thereby compensating for any timing misalignments in a continuous fashion within a feedback loop.

Due to the very large bandwidth of UWB signals, the main lobe of the cross-correlation function is relatively narrow and may decay rapidly, which may result in high sampling frequency constraints to recreate the waveform template in order to exploit the ELGS symmetry property. Further, signal waveform replicas may be difficult to detect for UWB signals in realistic unknown multipath channels. Moreover, a high sampling frequency (typically 4 to 8 times the bandwidth), being necessary for the received signal to extract the early and late samples in ELGS circuits, leads to a high power consumption. And, such high power consumption is generally a disadvantage, more particularly, for low cost and low power devices intended to be used in UWB-LDR applications.

On the other hand, lowering the sampling frequency, for example, sampling around Nyquist rate, which is used to limit the power consumption, limits the accuracy of the digital signal representation. Thus, using an ELGS for estimating the clock drift may be difficult to implement in the context of UWB pulsed signals, especially for low power sensor devices.

SUMMARY OF THE INVENTION

An object of the invention is to address this problem and to provide an approach for clock drift estimation that may use low-cost crystals. Another object is to provide an approach suitable for coherent and non-coherent receiver architectures while being able to provide a highly accurate drift estimation, for example, less than 1 ppm (parts per million). Another object is to provide a low complexity architecture that may reduce memory use.

According to an aspect, it is provided a method for estimating drift between a first clock used in a digital transmission processing of a first Ultra Wide Band (UWB) pulse train signal and a second clock used in a digital reception processing of a second UWB pulse train signal resulting from a transmission of the first UWB pulse train signal. The method may include sampling the second UWB pulse train signal, and calculating trellis information representative of a trellis comprising reference paths respectively associated to different reference values of the drift and including sample transitions of a sampled third signal from the sampled second UWB pulse train signal. The method may further include processing the sampled third signal along the trellis for obtaining a path metric for each processed reference path, and selecting the processed reference path having a greatest path metric, the drift being the reference value associated to the selected processed reference path.

More particularly, each path may include, for example, consecutive nodes spaced by a trellis step corresponding to a time interval greater than or equal to the pulse repetition period of the second signal and samples transitions of the sampled third signal between consecutive nodes.

Furthermore, processing the third signal along the trellis includes, for example, selecting at an initial instant at least one sample within a pulse repetition period and, for each selected sample, going trellis step by trellis step over at least some of the reference paths starting from the selected sample. Moreover, the processing may further include for each path, accumulating at each node of the path the level of the corresponding sample of the third signal thereby obtaining the path metric. Thus, according to this trellis approach, it is possible to "follow" possible drift by computing a likelihood metric, which allows estimation of the drift with high accuracy, and in particular, by selecting the path having the greatest path metric.

The maximum number of reference paths within a trellis depends on the length (number of trellis steps or nodes of the path). However, depending on the uses of the desired application, the number of reference paths of the trellis used for the processing may be smaller than the maximum number. It is also possible to determine and store an initial trellis having all possible reference paths and using in the processing step, a part of the initial trellis as the trellis.

Further, the resolution (accuracy) in the drift estimation depends on a maximum absolute value of the relative drift between the two clocks, the sampling period, the length of the trellis (number of trellis steps) and the duration of the pulse train signal (for example, the preamble of this signal), during which the processing is performed. All of these parameters may be chosen by the person of ordinary skill in the art depending on the intended use of the desired application. But again, it is possible to either calculate directly the actual trellis, taking into account the particulars of the application in terms of accuracy, for example, or to calculate and store trellis information representative of an initial trellis, giving the finest resolution and to use as the trellis a part of this initial trellis in the processing step.

Further, it is possible to choose a trellis step equal to the pulse repetition period, and to perform the drift estimation over the entire pulse train by individually processing each pulse waveform. In other words, in such a case, the third signal would be the sampled second signal. However, to reduce the processing, and consequently memory requirements, the notion of the "smallest observable" drift in the digital domain is preferably considered. It simply defines the minimum time period after which a sample transition can be observed due to an eventual clock drift. In other words, according to such an embodiment, the method may further comprise determining from the sampling period, the pulse repetition period, and a fixed maximum absolute value of the drift between the two clocks, a reference time interval, during which no sample transition over the time due to an eventual clock drift can be perceived. The time interval may be the reference time interval.

In such a case, it would then be possible to consider as the third signal, the individual pulses of the second signal timely spaced by the reference time interval. However, in order to increase the signal-to-noise ratio (SNR) and to improve the estimation and complexity performance, consecutive sampled pulses of the second signal are accumulated during each trellis step thereby obtaining a train of sampled accumulation pulses timely separated by the reference time interval. The third sampled signal may be the train of sampled accumulation pulses.

According to an embodiment, it is possible to process along the trellis all the samples within a pulse repetition period. However, to relax the hardware requirements, the number of samples to be processed can be limited. Thus, according to an embodiment, the selecting sub-step of the processing step may comprise selecting at least one sample, for example, several samples, having a level greater than a threshold.

It is also particularly advantageous to implement a windowing scheme to reduce the memory requirements without altering the performance. In other words, the processing step may be performed according to a windowing scheme and includes keeping for each processing window only a subset of most likely path candidates among the reference paths. When the second signal comprises a preamble including pulses having known characteristics, the processing step is preferably performed over at least a part of the preamble. The first and second UWB signals may fulfill the requirements of the IEEE 802.15.4a standard.

According to another aspects a device is provided for estimating drift between a first clock used in a digital transmission processing a first UWB pulse train signal and a second clock used in a digital reception processing of a second UWB pulse train signal resulting from the transmission of the first UWB pulse train signal. The device may include a sampler for sampling the second UWB pulse train signal, and a first memory for storing trellis information representative of a trellis including reference paths respectively associated to different reference values of the drift, the trellis including samples transitions of a sampled third signal from the sampled second UWB pulse train signal. The device may further include a processor for processing the third signal along the trellis for obtaining a path metric for each processed reference path, and a drift estimator for selecting the processed reference path having a greatest path metric, the drift being the reference value associated to the selected processed reference path.

Advantageously, each path includes consecutive nodes spaced by a trellis step corresponding to a time interval greater than or equal to the pulse repetition period of the second signal and samples transitions of the sampled third signal between consecutive nodes. The device may further comprise control means or a controller adapted to deliver an initial activation signal at an initial instant. The processing means or a processor are adapted to process the third signal along the trellis in response to the initial activation signal and include, for example, first selecting means or a first selector for selecting at the initial instant at least one sample within a pulse repetition period, and path metric determination means or a path metric determiner adapted for each selected sample to go trellis step by trellis step over at least some of the reference paths starting from the selected sample and for each path to accumulate at each node of the path the level of the corresponding sample of the third signal thereby obtaining the path metric.

According to another embodiment, the time interval is a reference time interval, during which no sample transition over the time due to an eventual clock drift can be perceived. The reference time interval is a function of the sampling period, the pulse repetition period, and a fixed maximum absolute value of the drift between the two clocks.

According to another embodiment, the device further comprises accumulation means or an accumulator adapted to accumulate consecutive sampled pulses of the second signal during each trellis step thereby obtaining a train of sampled accumulation pulses timely separated by the reference time interval. The third sampled signal may be the train of sampled accumulation pulse. According to an embodiment, the first selecting means comprises comparison means or a comparer having a first input for receiving a sample and a second input for receiving a threshold, and selection control means or a selection controller adapted to select at least one sample having a level greater than the threshold.

According to an embodiment, the control means is further adapted to successively activate the processing means according to a windowing scheme and further comprises management means or a manager adapted to keep only for each window a subset of most likely path candidates among the reference paths. According to another embodiment, the second signal comprises a preamble including pulses having known characteristics, and the control means is adapted to deliver the initial activation signal during the sampling of the preamble such that the processing means operates over at least a part of the preamble.

According to another aspect, it is also provided an apparatus belonging to an UWB communication system, for example, an UWB-LDR communication system, used for ranging application, and incorporating a device as defined above.

BRIEF DESCRIPTION OF THE DRAWINGS

Other advantages and features of the invention may appear on examining the detailed description of these embodiments, being in no way limiting, and of the appended drawings in which.

DETAILED DESCRIPTION OF THE PREFERRED EMBODIMENTS

Figure 1:
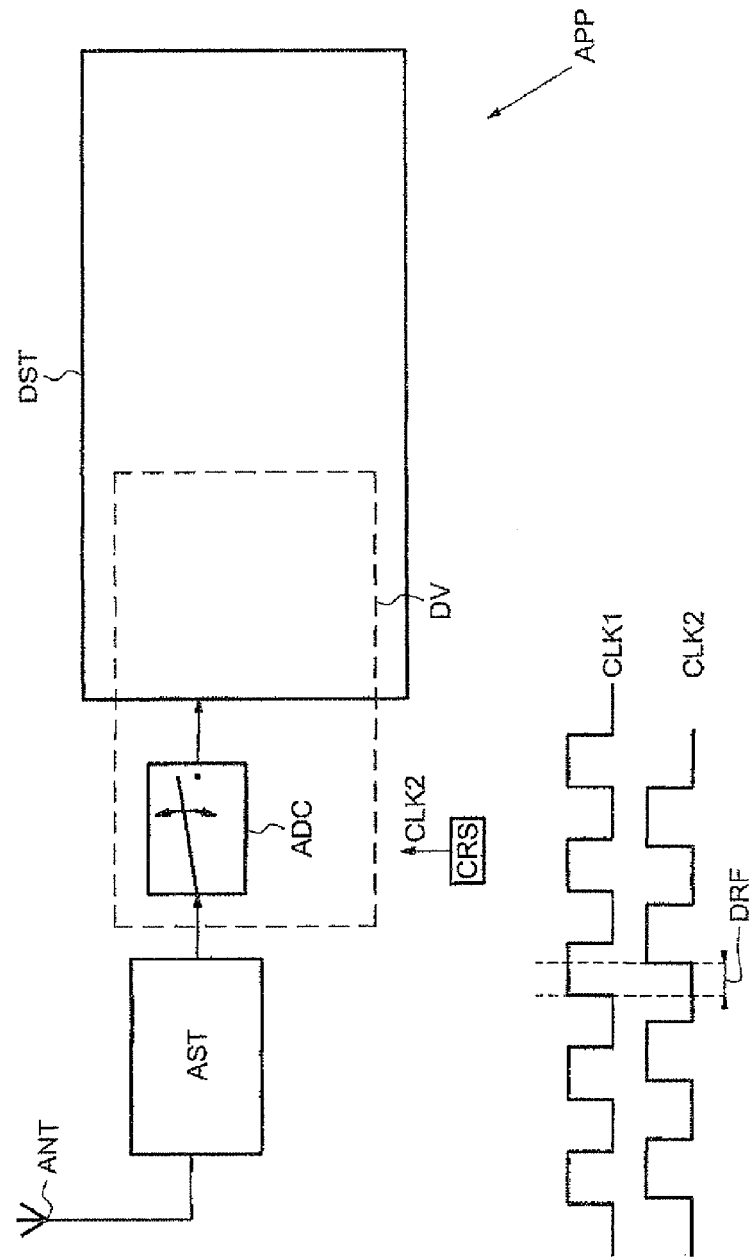
FIG. 1 illustrates diagrammatically an apparatus incorporating a device according to an embodiment of the present invention.

Referring now to FIG. 1, the reference APP relates to an UWB apparatus belonging to an UWB communication system and comprises a reception chain including conventionally an antenna ANT for receiving an UWB pulsed signal from another UWB apparatus belonging to the same UWB communication system. The UWB apparatus comprises conventionally an analog stage AST, in particular, for performing the frequency transposition followed by an analog-to-digital conversion stage ADC. The output of the stage ADC is connected to a digital processing stage DST which comprises conventional means, such as, channel estimation means or a channel estimator, synchronization means or a synchronizer and decoding means or a decoder. These means, being known, are not illustrated in FIG. 1 for simplification reasons.

The apparatus further comprises a crystal CRS delivering a clock CLK2 used directly or indirectly in the digital reception processing performed by the reception chain. Further to these conventional means, the apparatus APP according to this embodiment also comprises a device DV for estimating the actual value of an eventual relative drift DRF between the clock CLK2 (or crystal), and the clock (or crystal) CLK1 used in the digital transmission processing of the UWB pulse train signal having been transmitted from the other apparatus (the transmitting apparatus).

As it may be explained in more detail thereafter, this device DV can be considered as being, for example, a trellis-based maximum-likelihood crystal drift estimator. The embodiment which may be now described with reference to the following Figures, is more particularly directed to the IEEE 802.15.4a standard and more particularly to ranging applications in UWB-LDR systems, although the embodiment is not limited to this particular application.

Figure 2:
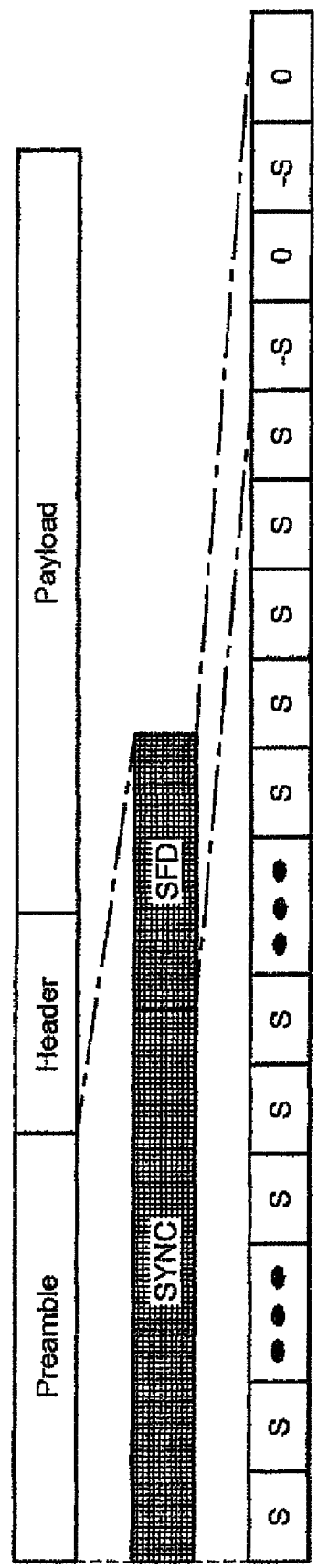
FIG. 2 illustrates a preamble structure according to IEEE 802.15.4a standard, according to the prior art.

A frame structure of an UWB pulse train signal according to IEEE 802.15.4a standard is illustrated diagrammatically in FIG. 2. More precisely, the frame comprises a preamble followed by a header followed by a payload field (data field). The preamble comprises a synchronization field SYNC and a start frame delimiter field SFD. The synchronization field SYNC comprises known preamble symbols S, which may be used, at least partially, for the drift estimation.

Figure 3:
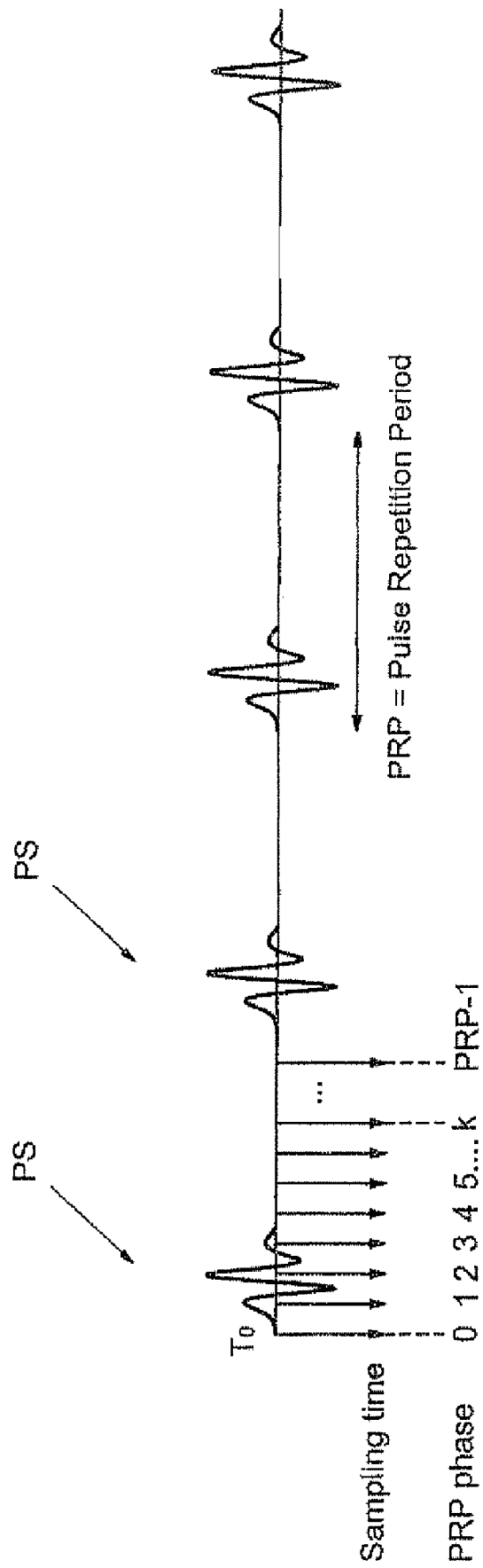
FIG. 3 illustrates diagrammatically pulses of an UWB signal, according to the prior art.

As illustrated in FIG. 3, a preamble symbol S comprises several pulses PS, for example, 31 pulses. Each pulse PS, has a predetermined width, for example, smaller than 1 ns or about 360 picoseconds. The successive pulses PS are respectively included into successive time windows called pulse repetition period PRP. In UWB-LDR applications, each transmitted pulse of the preamble, and more particularly, the synchronization field SYNC, is associated with a so-called ternary synchronization code taking values 0, 1 or −1 allowing associating a logical value to the pulse.

The signal (also called second signal) delivered by the analog stage AST of the apparatus APP is sampled within the ADC stage, according to a sampling period $T_S$. "k" can be seen as the k-th phase within one PRP (or the k-th sample within one PRP) and may be referred to as PRP phase in the following. The sampling frequency $F_S$ can be, for example, equal to 1 or 2 GHz, which is perfectly compatible with PRP values equal, for example, to 32 ns or 128 ns.

The crystal of the transmitting apparatus has inaccuracies, which are expected to be as large as +/−40 ppm for low cost devices. It is the same for the crystal of the receiving apparatus APP. Thus, the relative clock drift between these two crystals (or clocks) has a maximum absolute value $\Delta_{max}$ equal to 80 ppm and is comprised between $-\Delta_{max}$ and $+\Delta_{max}$.

Figure 4:
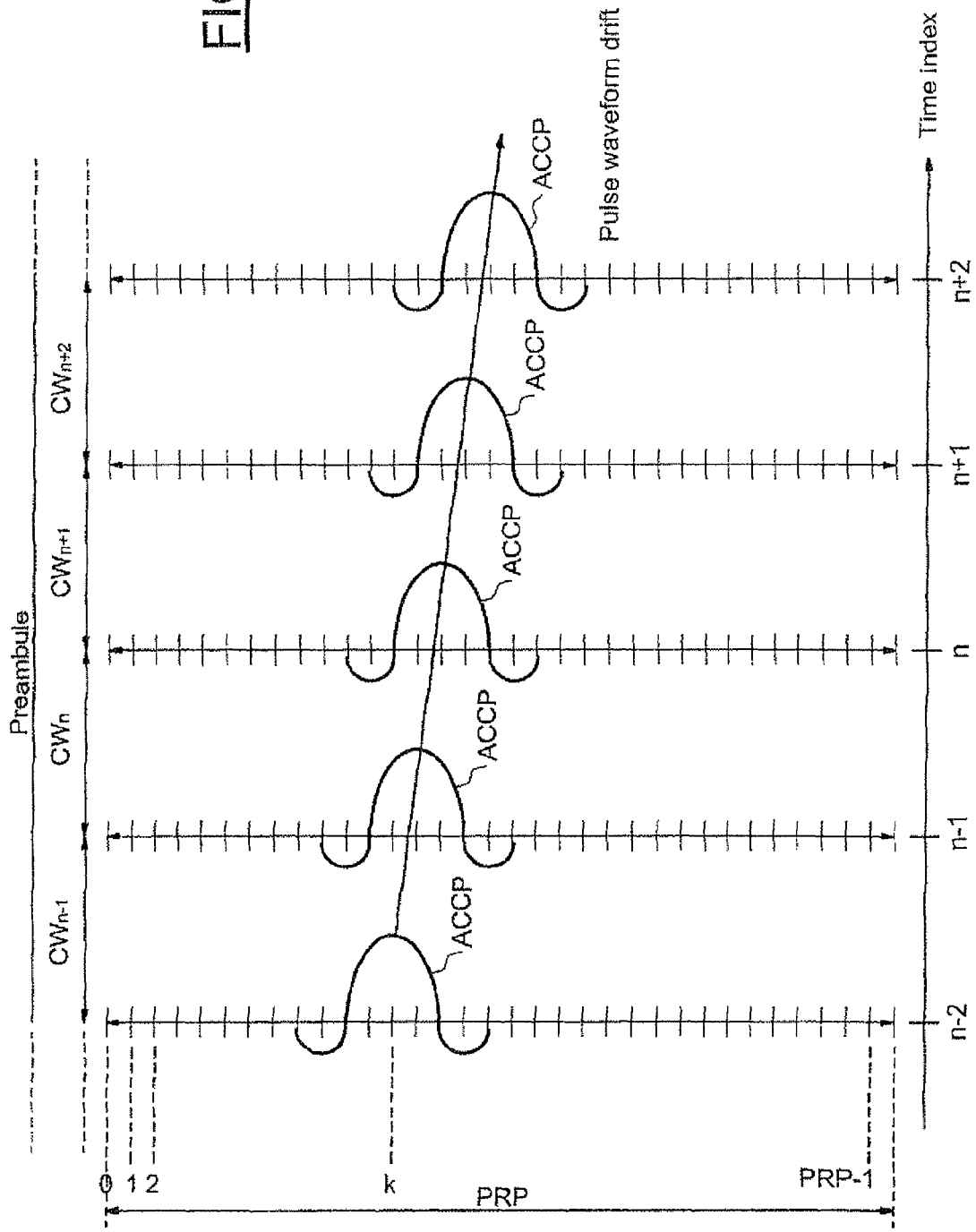
FIGS. 4-7 illustrate diagrammatically a first embodiment of a method according to the present invention.

FIG. 4, which may be explained in more detail thereafter, illustrates the pulse waveform drift due to an actual clock drift (assumed to be constant here) between the two crystals. More precisely, as it can be seen in this FIG. 4, between each observation time or time index, the pulse within the PRP is timely shifted.

Figure 5:
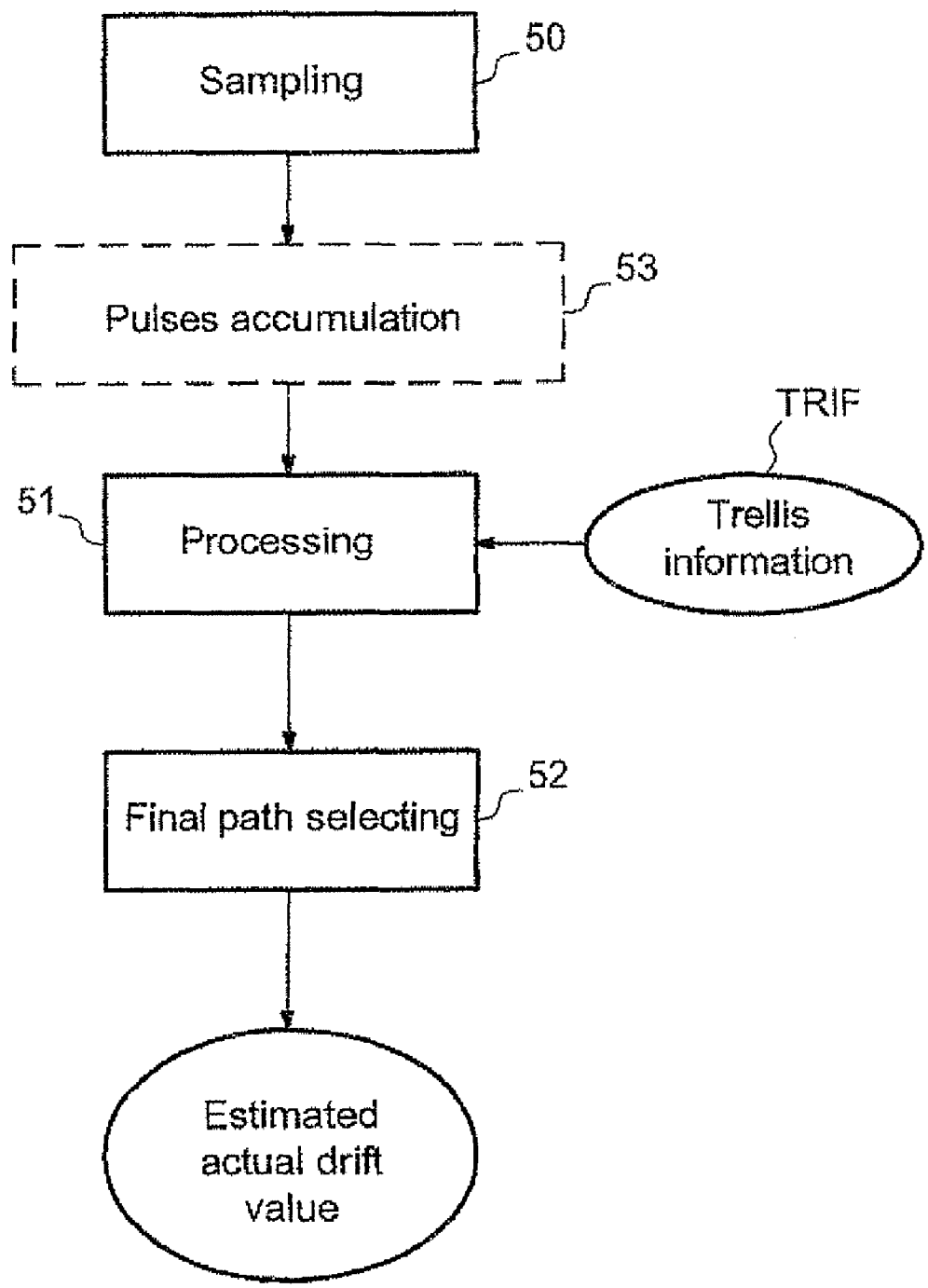

Generally speaking, as illustrated in FIG. 5, the method according to this embodiment for estimating the actual value of the eventual relative drift between the two clocks comprises sampling the signal delivered by the analog stage AST (step 50), elaborating trellis information TRIF representative of a trellis including reference paths respectively associated to different reference values of the drift, processing (step 51) a third signal issued from the sampled signal delivered by the ADC stage along the trellis, for obtaining path metrics, and selecting the path having the greatest path metric (final path selecting step 52), the estimated actual drift value being the reference value associated to the selected path.

Figure 6:
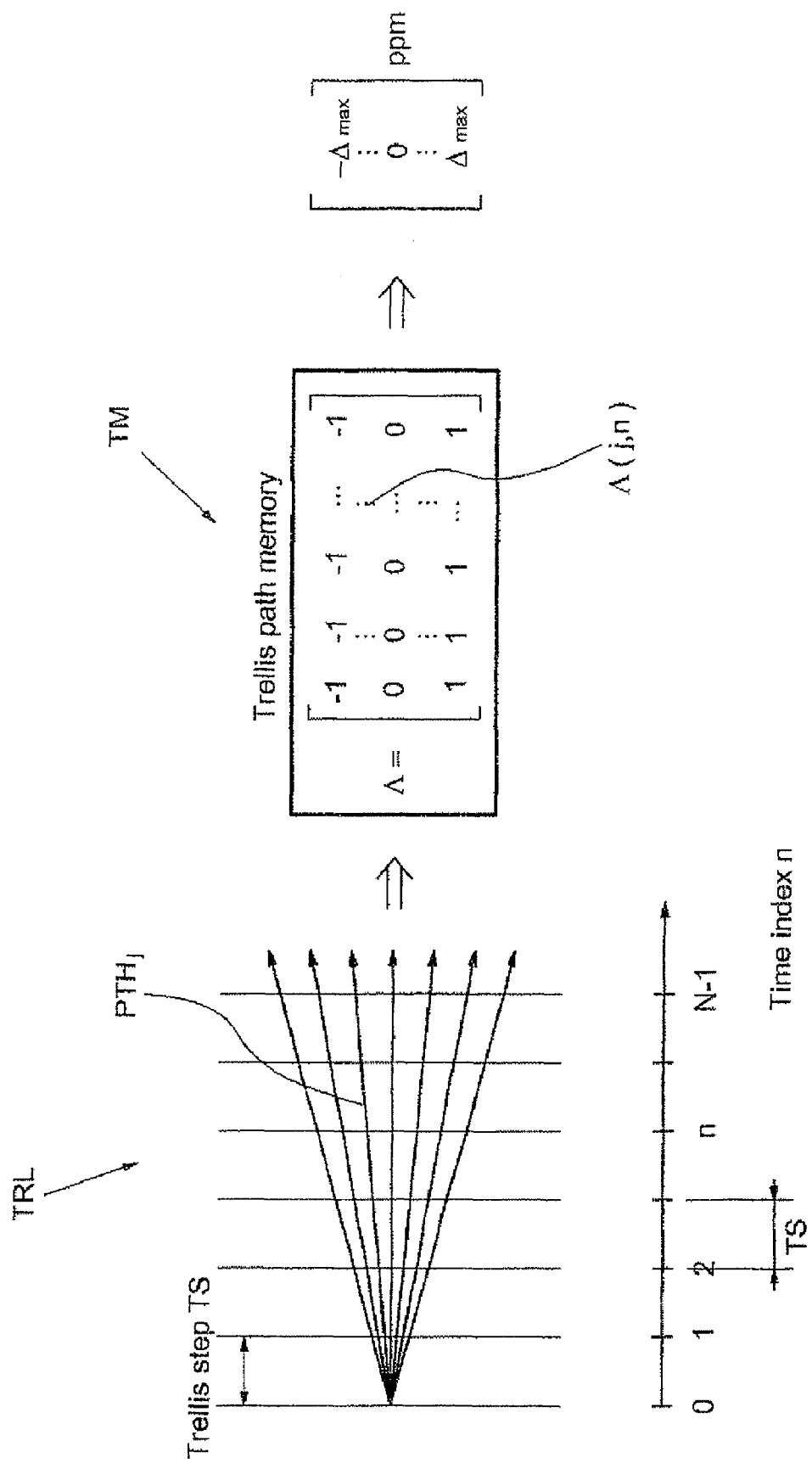

As illustrated in FIG. 6, the trellis TRL includes reference paths $PTH_j$ respectively associated to different reference values for the drift as it may be explained in more detail thereafter.

Each path includes consecutive nodes spaced by a trellis step TS. This trellis step corresponds to a time interval that is generally greater than or equal to the pulse repetition period. Although this trellis step TS may correspond to a pulse repetition period, it corresponds here, as it may be explained thereafter, to a reference time interval or coherent window, greater than the pulse repetition period PRP. Each path also includes samples transitions between consecutive nodes. Two consecutive nodes are separated by the trellis steps.

Figure 7:
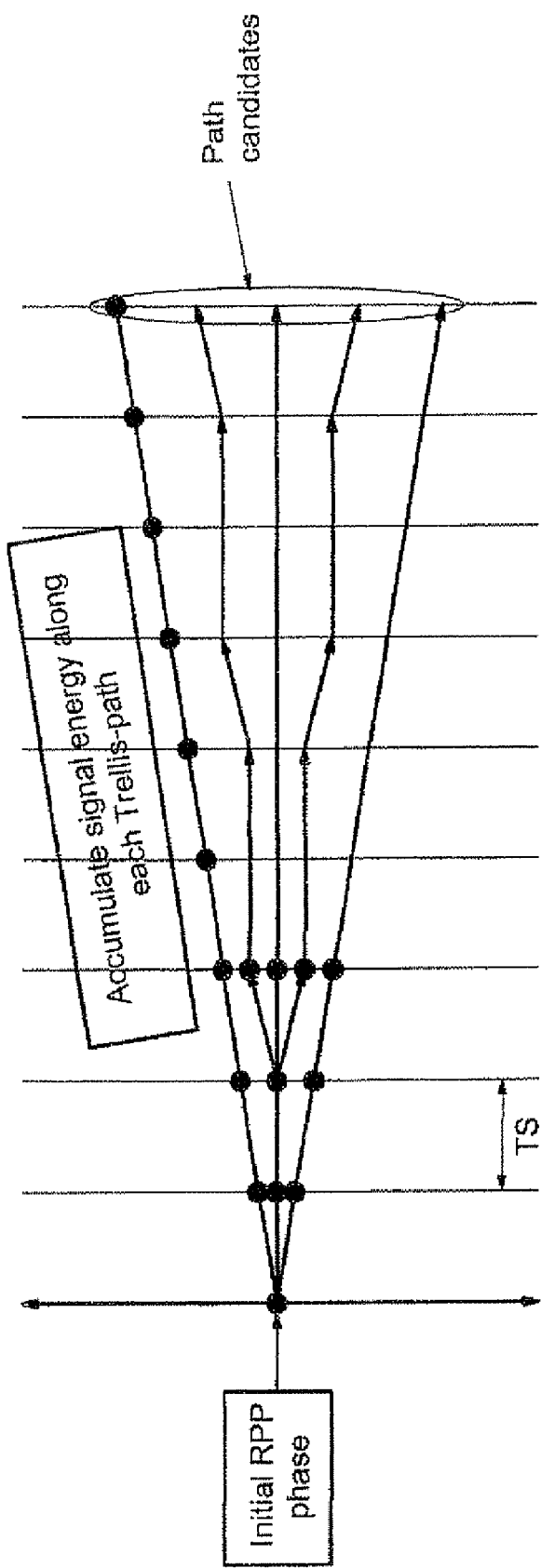

Turning now to FIG. 7, the processing step 51 includes selecting at an initial instant, at least one sample (initial PRP phase in FIG. 7) within a pulse repetition period PRP. And, for each selected sample, the processing step comprises going trellis step by trellis step, over at least some of the reference paths, starting from the selected sample or initial PRP phase, and, for each path, accumulating at each node of the path the level or energy of the corresponding sample, thereby obtaining a path metric. Then, among all the paths candidates, the path having the greatest path metrics is selected, thereby obtaining the estimated actual drift value.

Figure 8:
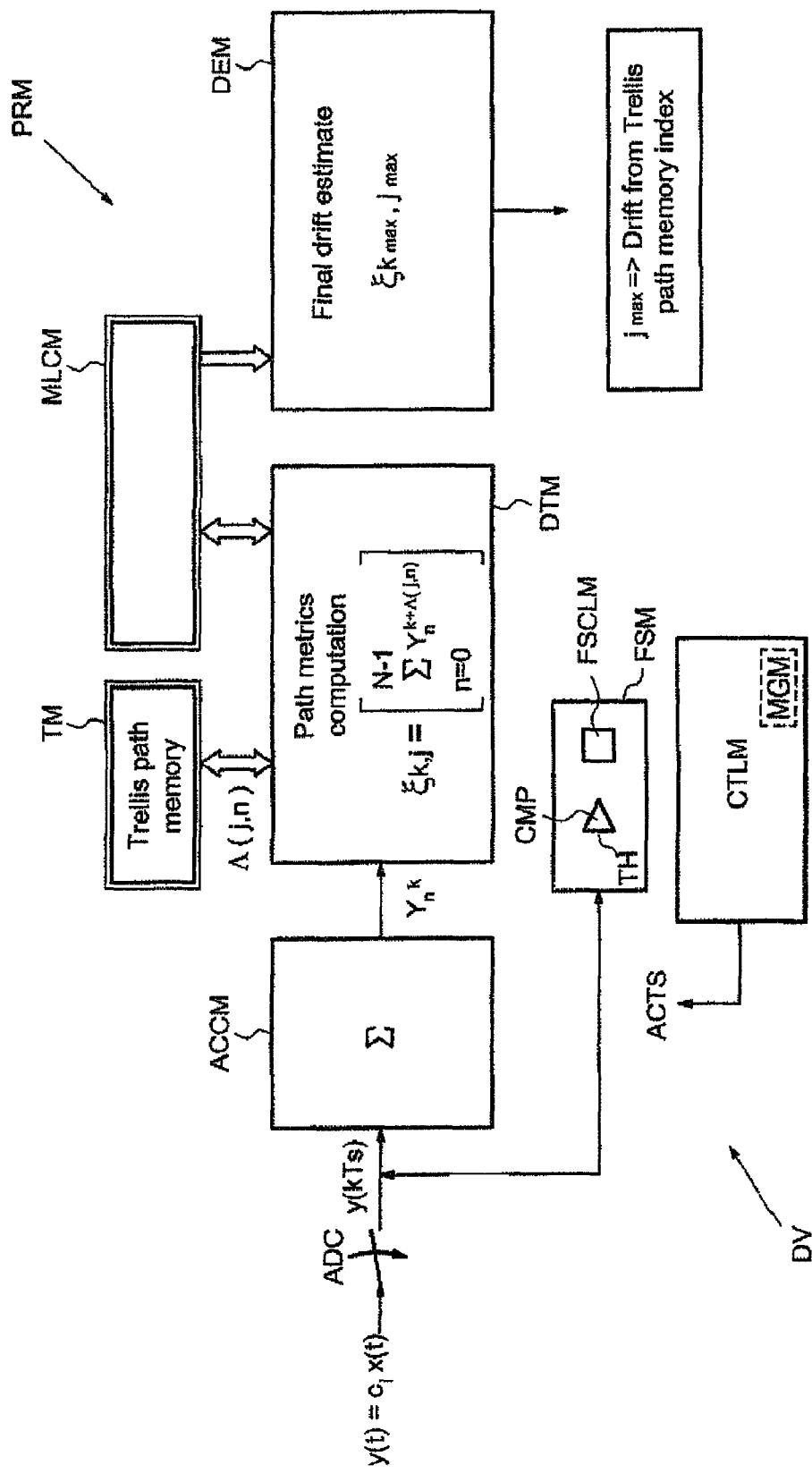
FIG. 8 illustrates a detailed diagram of a device according to an embodiment of the present invention.

After these general considerations about this embodiment, more details about some features of the embodiment may be now described with reference also to FIG. 8. The preamble pulse train of the transmitted UWB-LDR signal can be expressed as $$x(t) = \sum_{k=0}^{N_s-1} \sum_{i=0}^{N_c-1} c_i \cdot g(t - k \cdot N_c \cdot T_p - i \cdot T_p) \qquad (1)$$

where $c_i$ specifies the Ternary synchronization code taking values $\{0,1,-1\}$, $g(t)$ is the UWB pulse waveform, Tp specifies the pulse repetition period (PRP), Ns defines the number of synchronization symbols per preamble and Nc the number of (pulse) codes per synchronization symbol of the synchronization field SYNC.

The channel impulse response is modeled by the well-known tapped delay line expression $$h(t) = \sum_{j=0}^{L-1} \alpha_j \cdot \delta(t - \tau_j) \qquad (2)$$

where αi and τi represent the gain and delay associated to the i-th channel path and L is the number of resolvable path, i.e. the minimum path interval is inversely proportional to the bandwidth of the impulse g(t).

The received signal can then be modeled as $$y(t) = \sum_{i=0}^{N_c-1} c_i \sum_{j=0}^{L-1} \alpha_j g(t - i \cdot T_p - \tau_j - i \cdot T_p \cdot \Delta) + n(t) \qquad (3)$$

where Δ specifies the (constant) relative clock drift between a transmit and receive apparatus and n(t) accounts for the additive white Gaussian noise (AWGN) and other interference. If it is further assumed that the PRP is larger than the excess delay spread of the channel, i.e. $T_p > \tau_i \ \forall_i$, and that $\alpha_m$ specifies the strongest path, y(t) can be reformulated as $$y(t) = \alpha_m \sum_{i=0}^{N_c-1} c_i \cdot g(t - i \cdot T_p(1 + \Delta) - \tau_m) + y'(t) + n(t) \qquad (4)$$

where y'(t) specifies the remaining (independent) multipath components which do not impact the drift estimation; that is, the receiver can lock onto the strongest signal path to estimate the drift. However, y'(t) components can also be used to improve the performance in a least-square error sense.

Since the implementation of the drift estimation is done in the digital domain the sampled signal $y(kT_s)$ in (4) can be reformulated (without taking into account y' components and the noise) as:

$$y_i(kT_s) = \alpha_m \cdot c_i \cdot g(kT_s - i \cdot T_p(1+\Delta) - \tau_m)_s \qquad (5)$$

where Ts is the sampling period, index $i = \lfloor k \cdot Ts/Tp \rfloor$ is incremented modulo Nc and index k (modulo $P = \lfloor Tp/Ts \rfloor$) is the k-th phase within one PRP, (PRP phase). $\lfloor \ \rfloor$ designates the inferior integer part function. Moreover, to simplify the notations, the received signal y(t) is assumed to be already bandpass filtered where the filter response closely matches the pulse shape g(−t).

Although the drift estimation can be done over the entire pulse train by individually processing each pulse waveform, a reference time interval, during which no sample transition over the time due to an eventual clock drift can be perceived, is determined. In other words, according to this embodiment, the reference time interval corresponds to the notion of the "smallest observable" drift in the digital domain; it simply defines the minimum time period after which one can observe a drift in the PRP phase. It is defined by the sampling period Ts and can be linked to the PRP Tp and the maximum absolute crystal offset Δmax as follows:

$$M \cdot \Delta_{max} \cdot T_p \leq T_s$$

where M can be interpreted as a processing gain. In other words, this reference time interval is equal to $M \cdot T_p$ where $$M = \left\lfloor \frac{T_s}{\Delta_{max} \cdot T_p} \right\rfloor$$

This reference time interval also corresponds to the trellis step TS or to the coherent window $CW_n$ illustrated in FIG. 4. During each coherent window, there is no detectable drift. And, the number of coherent window, N, is defined by the preamble length $T_{Preamble}$ as:

$$N = \left\lfloor \frac{T_{preamble}}{M \cdot T_p} \right\rfloor$$

$T_{preamble}$ designates here the actual preamble length which is used for the drift estimation. It can be the entire preamble or a part thereof.

The processing gain achievable within a set of UWB-LDR PRPs is depicted in Table I for different sampling frequencies $F_S$ with respect to ±40 ppm crystals.

TABLE I

PROCESSING GAIN M, PULSE REPETITION PERIOD (PRP) AND SAMPLING FREQUENCY $F_s$ TRADE-OFFS WITH RESPECT To ±40 PPM CRYSTALS

| $F_s$ [GHz] | PRP = 32 ns | PRP = 128 ns |
|---|---|---|
| 1 | $M_{db} \cong 25.9$ dB | $M_{db} \cong 19.8$ dB |
| 2 | $M_{db} \cong 22.9$ dB | $M_{db} \cong 16.8$ dB |

Since no drift is perceived during the reference time interval $M \cdot T_p$, successive pulses of the same PRP phase can be accumulated to increase the signal-to-noise-ratio (SNR) and thus, to improve the estimation and complexity performance. This pulses accumulation 53 (FIG. 5), leads to a third signal, on which the processing step 51 may be performed, including accumulated pulse ACCP as those illustrated in FIG. 4.

Mathematically, this boost in processing gain can be formulated as follows:

$$Y_n^k = \sum_{m=n \cdot M}^{M(n+1)-1} y_i\left[\left(m\left\lfloor \frac{T_p}{T_s} \right\rfloor + k\right) \cdot T_s\right]$$

where $y_i(kT_s)$ is defined in (5), k specifies the PRP phase and $n \leq N$ is the index of the integration (coherent) window. This pulses accumulation is performed in accumulation means ACCM delivering the samples $Y_n^k$ of this third signal (FIG. 8).

Turning now to the trellis TRL, it contains 2N−1 distinct paths, where N is the number of trellis steps (or coherent windows here). Moreover, the resolution of the Trellis-based drift estimator is related to the duration $T_{preamble}$ and the sampling period Ts as follows:

$$\text{Resolution} = \frac{\Delta_{max}}{N-1} = \frac{T_s}{T_{preamble}}$$

Intuitively, since a higher sampling clock results into a finer signal representation in the digital domain, the drifts are "observable" much sooner and hence fewer preamble pulses are required for the estimation process. The trade-off between estimation resolution, sampling frequency and preamble length is illustrated in Table II for the UWB-LDR system.

TABLE II

DRIFT ESTIMATION RESOLUTION IN PPM FOR UWB-LDR PREAMBLES

| $TT_{preambl}$ [µs] | $F_s = 1$ GHz | $F_s = 2$ GHz | $F_s = 4$ GHz |
|---|---|---|---|
| 64 | 15.63 ppm | 7.81 ppm | 3.91 ppm |
| 256 | 3.91 ppm | 1.95 ppm | 0.98 ppm |
| 1024 | 0.98 ppm | 0.49 ppm | 0.24 ppm |

Figure 9:
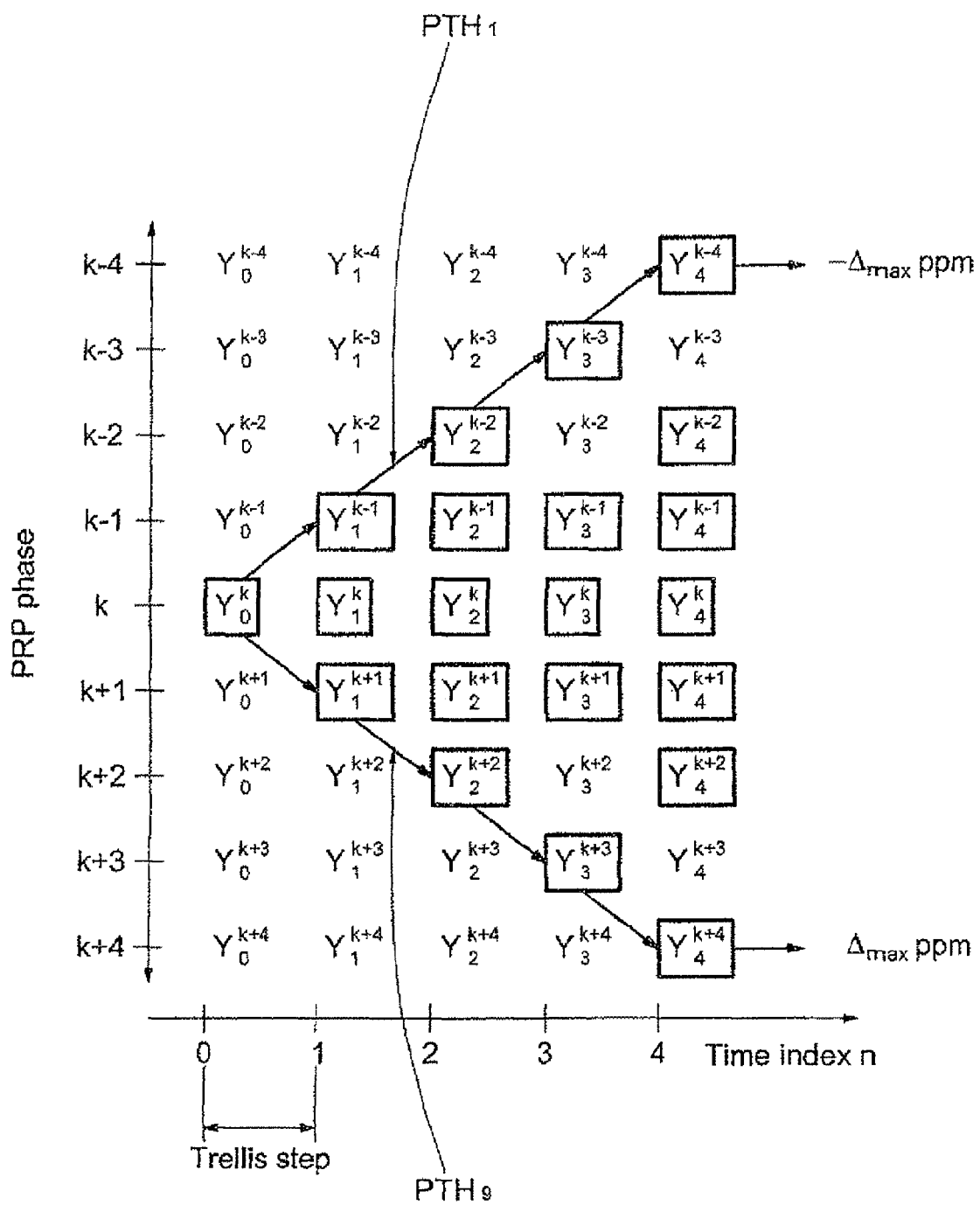
FIGS. 9-16 illustrate diagrammatically an example of a trellis, according to the present invention.
Figure 10:
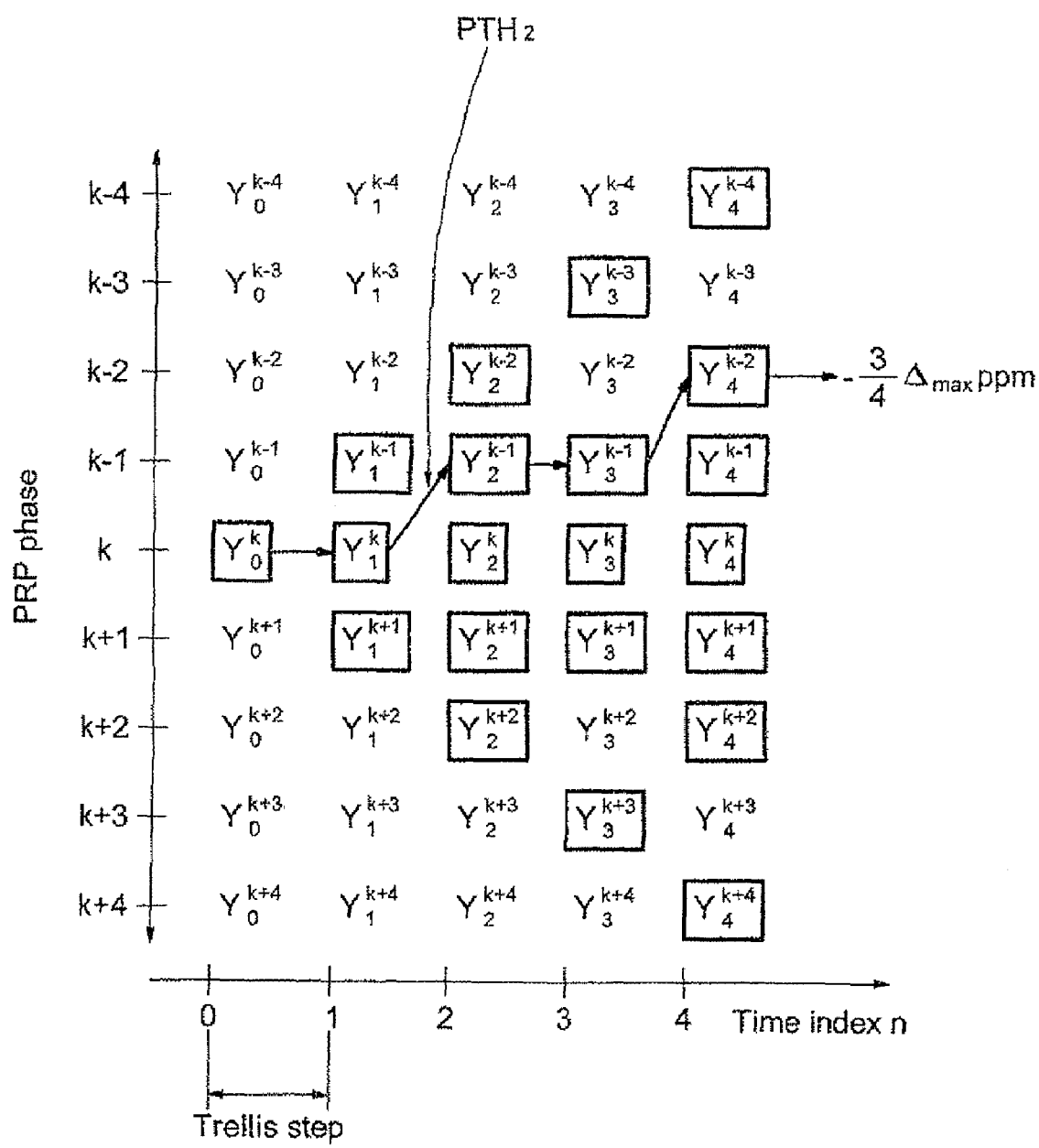
Figure 11:
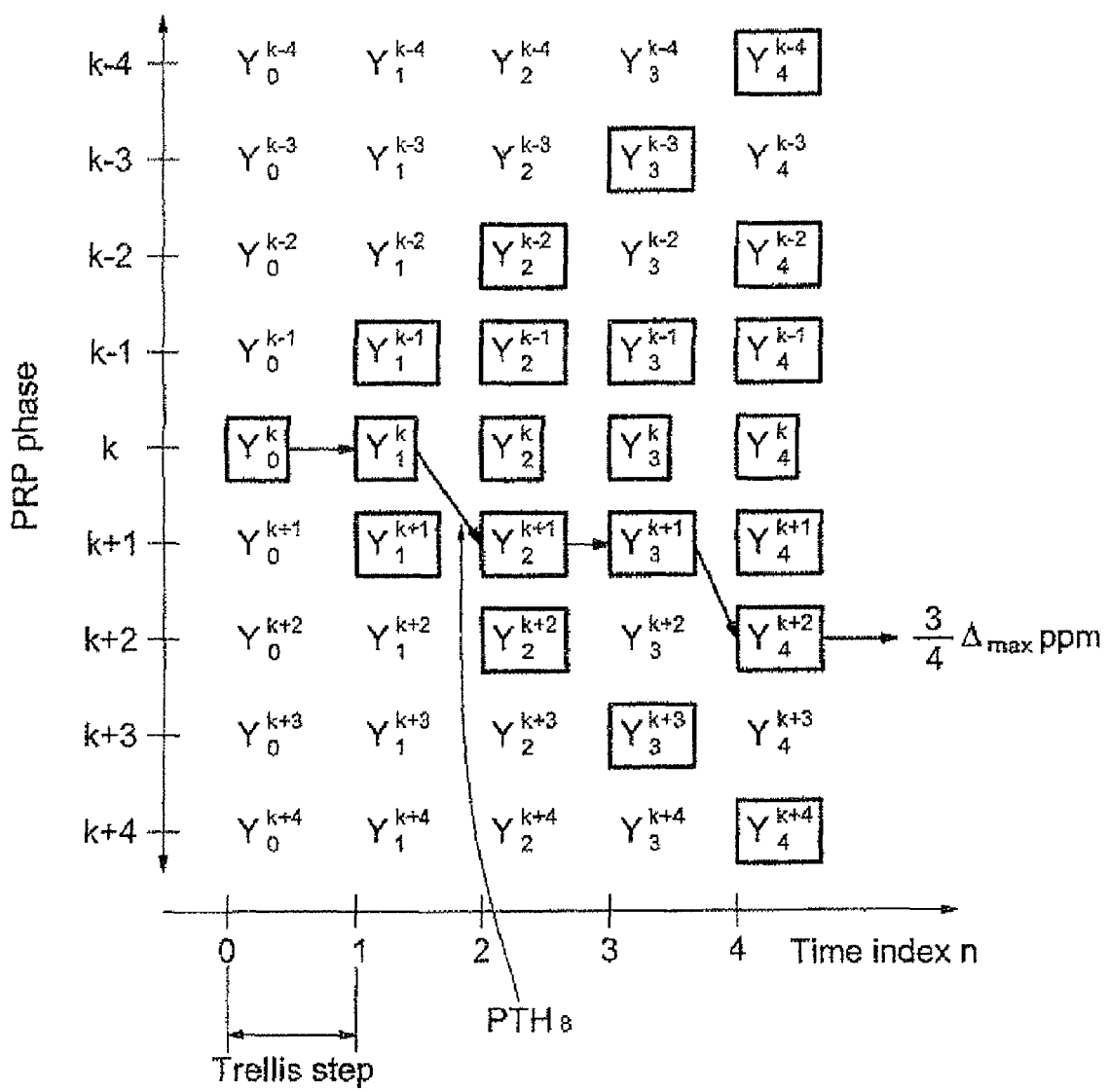
Figure 12:
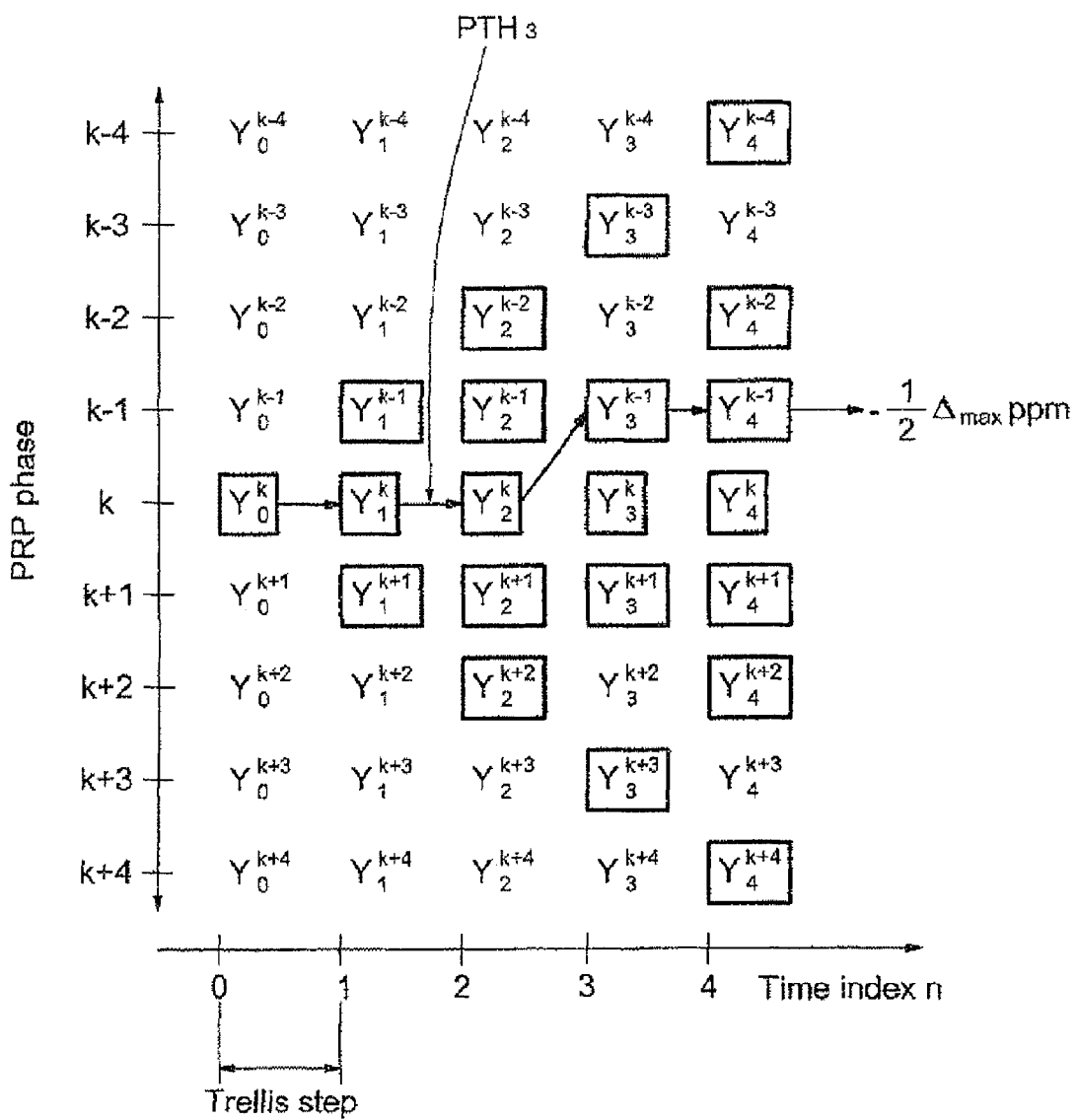
Figure 13:
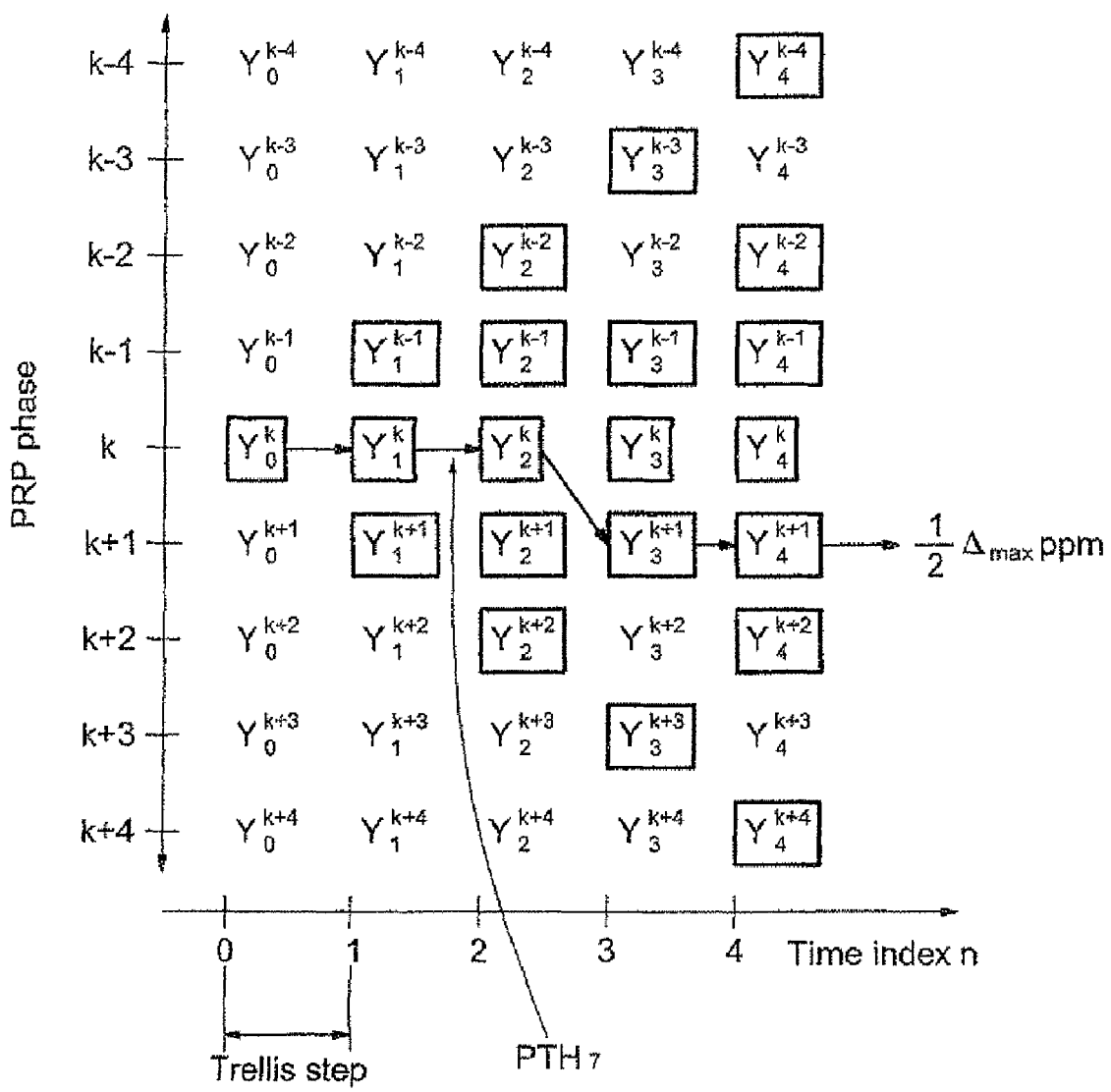
Figure 14:
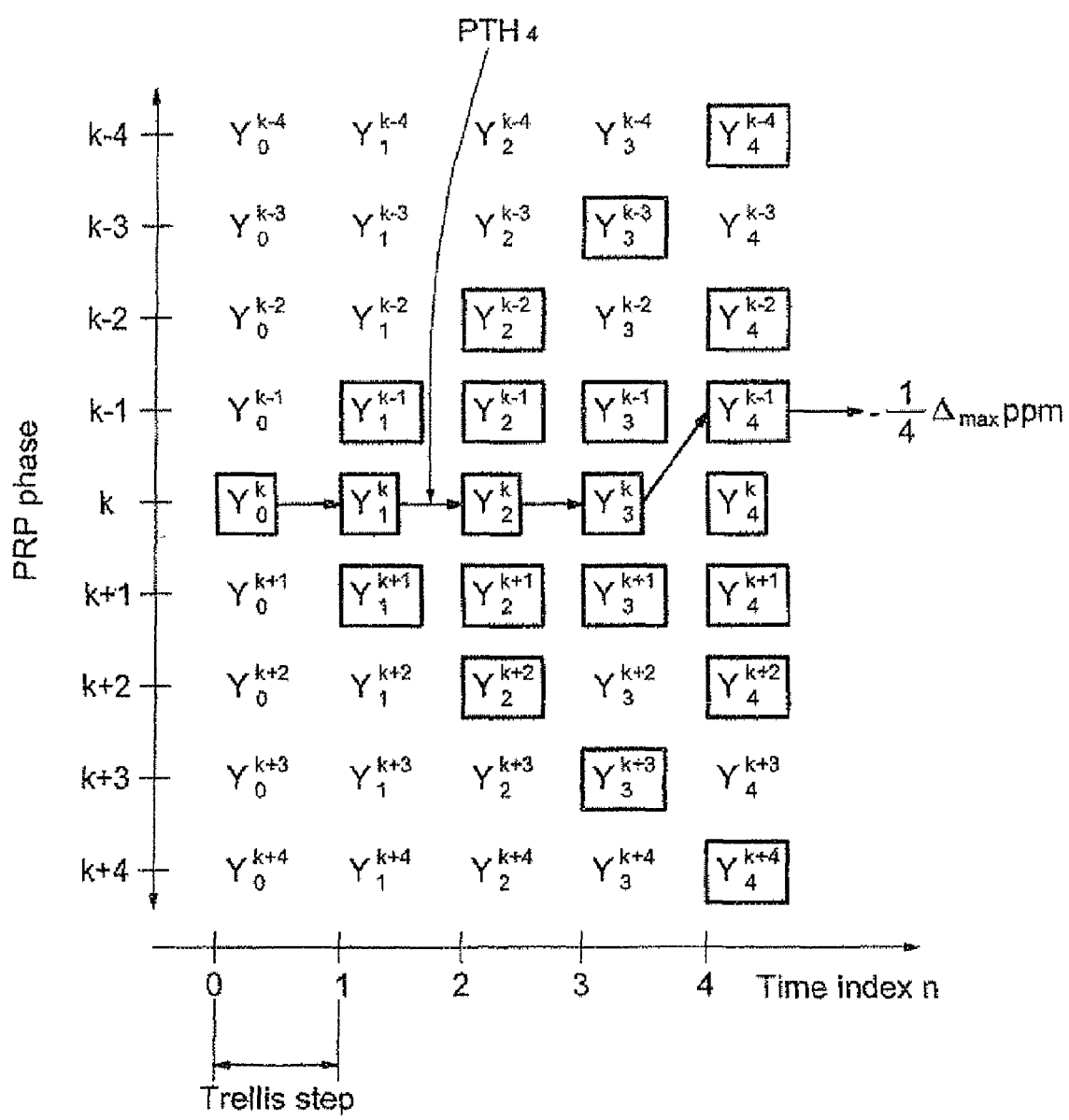
Figure 15:
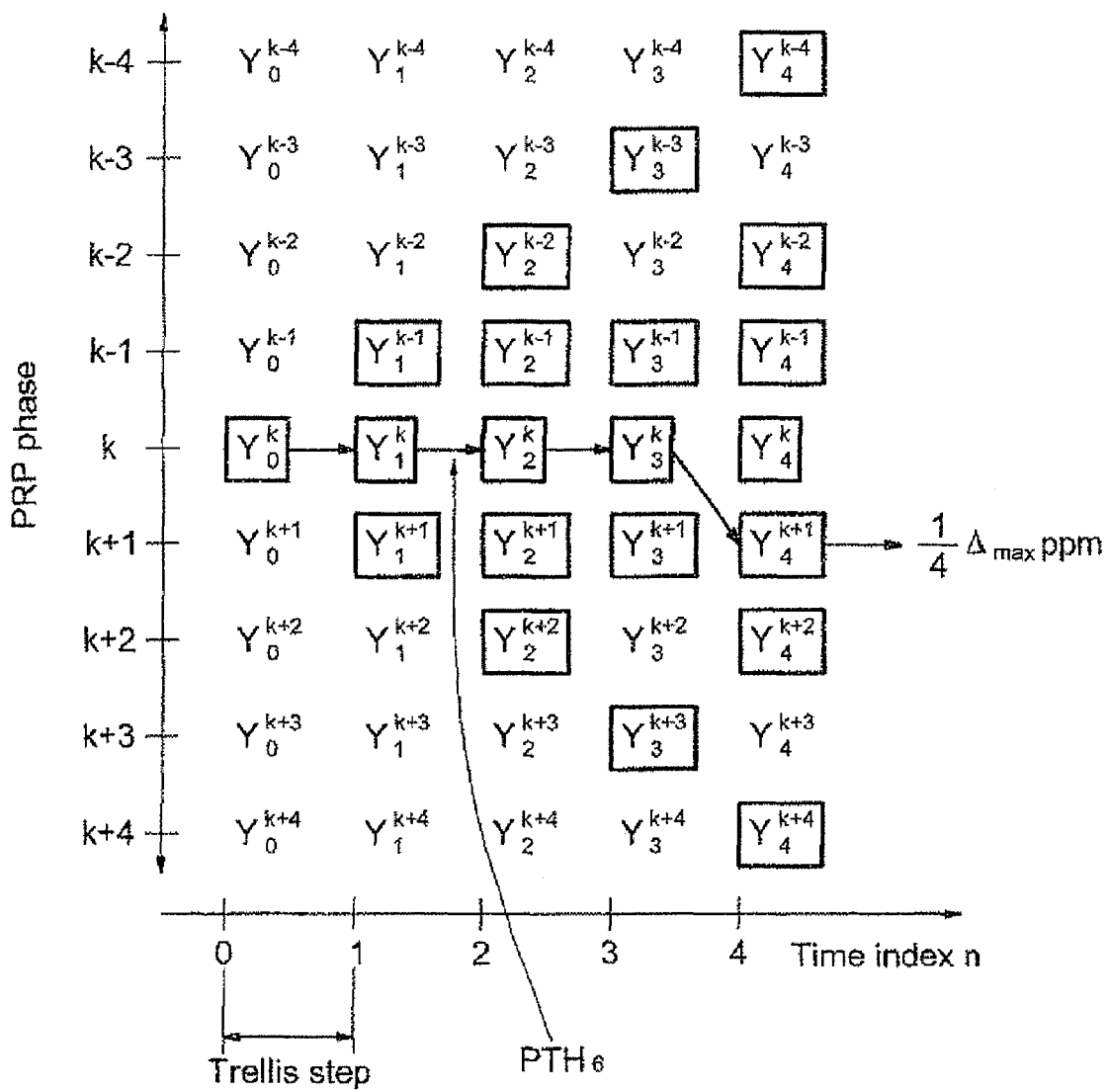
Figure 16:
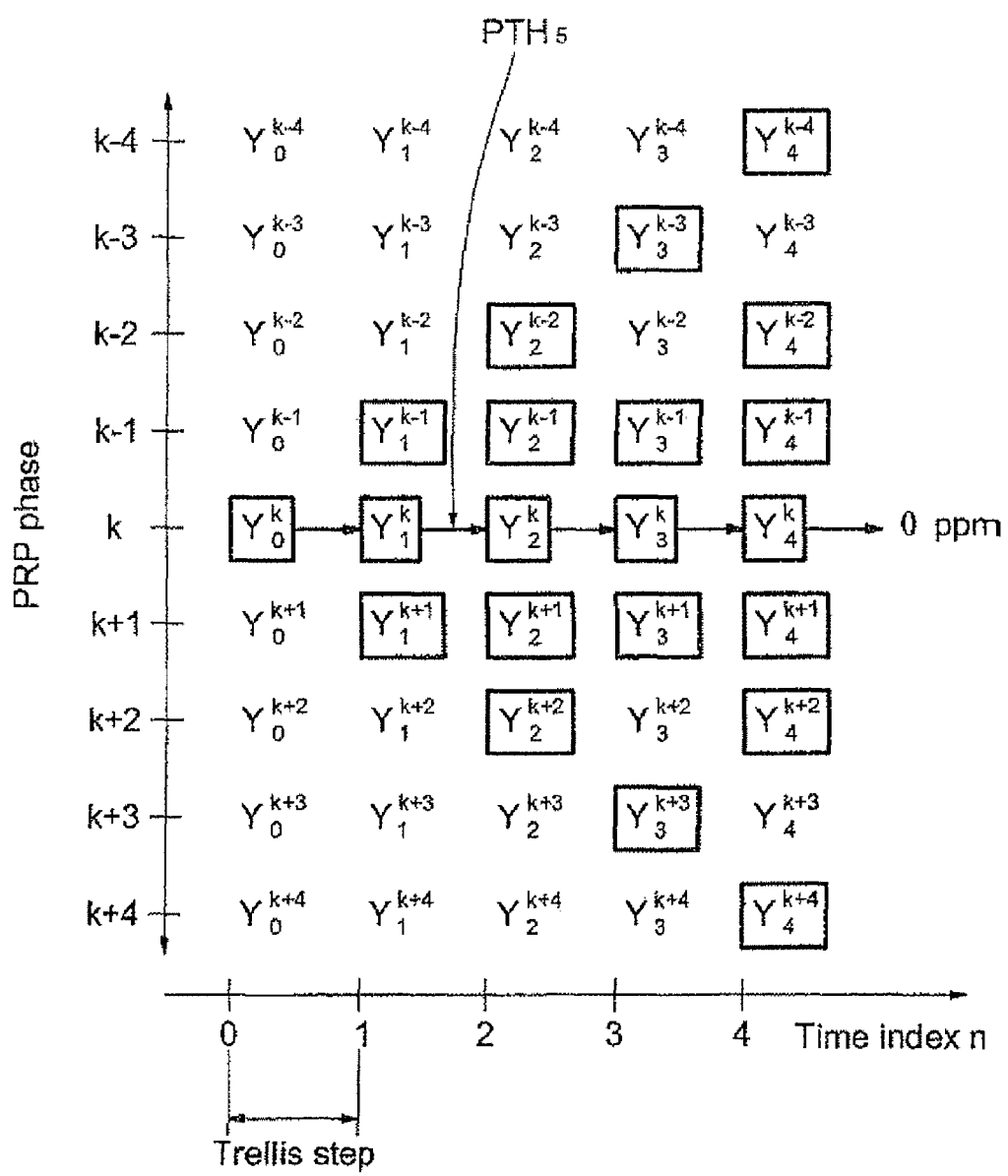

FIGS. 9-16 illustrate an example of a trellis having N=5 trellis steps (or coherent windows). The number of possible paths is accordingly equal to 9 and the resolution is $\Delta_{max}/4$. Further, FIGS. 9-16 illustrate the 9 possible paths for the k-th PRP phase. In FIG. 9, the path $PTH_1$ corresponds to a negative shift of one sample during each trellis step corresponding to a reference value equal to $-\Delta_{max}$ ppm for the relative clock drift. The path $PTH_9$ corresponds to a positive shift of one sample during each trellis step corresponding to a reference value equal to $\Delta_{max}$ ppm.

The path $PTH_2$ (FIG. 10) corresponds to a negative shift of one sample every two trellis steps or time indexes, corresponding also to a reference value equal to $-\frac{3}{4} \Delta_{max}$ ppm for the drift. Path $PTH_8$ (FIG. 11) corresponds to a positive shift of one sample every two time indexes, leading to a reference value equal to $\frac{3}{4} \Delta_{max}$ ppm. Path $PTH_3$ (FIG. 12) corresponds to a negative shift of one sample every three time index, leading to a reference value equal to $-\frac{1}{2} \Delta_{max}$ ppm.

Path $PTH_7$ (FIG. 13) corresponds to a positive shift of one sample every time index, leading to a reference value of $\Delta_{max}/2$ ppm. Path $PTH_4$ (FIG. 14) and path $PTH_6$ (FIG. 15) correspond respectively to a negative shift and a positive shift of one sample every four time index, leading respectively to reference values equal to $-\Delta_{max}/4$ ppm and $\Delta_{max}/4$ ppm. Finally, path $PTH_5$ corresponds to no shift along the trellis leading to a reference value of 0 ppm.

Based on the trellis TRL, it is possible to define a trellis matrix $\Lambda$ which recreates all possible drifts through the trellis diagram for any PRP phase as illustrated in FIG. 6 where the extrema $\{-\Delta max, 0, \Delta max\}$ are reported explicitly. Each binary value $\Lambda$ (j, n) located as the row j and the column n of the trellis matrix, represent one trellis information.

All the trellis information forming the trellis matrix are stored in the trellis path memory TM. In response to an activation signal ACTS delivered by control means CTLM, at least some samples or PRP phases are selected (eventually all the samples or PRP phases are selected), and after accumulation in accumulation means ACCM, the path metrics $\xi_{k,j}$ are computed within determination DTM according to the following formula:

$$\xi_{k,j} = \left(\sum_{n=0}^{N-1} Y_n^{k+\Lambda(j,n)}\right)$$

in which index k designates all the selected samples or PRP phases, and j the index of the considered path.

As the computation of the path metrics is dominated by simple accumulation logic, the determination means DTM can be realized, for example, by corresponding logic circuit. The computed path metrics (candidate path metrics) are stored in a candidate memory MLCM.

To relax the hardware requirements, the number of PRP phases k to be processed can be limited. More precisely, the first selecting means FSM, which select at the initial instant the PRP phases to be processed, may comprise a threshold device including a comparator CMP able to compare the level of the sample with a threshold TH. Then, first selecting control means CLM can only select the samples which have a level greater than the threshold. It would be also possible to select only one sample, for example, the sample having the greatest level.

Finally, drift estimation means or a drift estimator DEM perform a final drift estimate by determining the greatest path metric designated here by both indexes $k_{max}$ and $j_{max}$. The path having the greatest path metric is designated by the index $j_{max}$. The estimated actual drift value is thus the reference value associated to the path designated by the index $j_{max}$. It should be noted that although it is preferable to perform a coarse synchronization before the drift estimation for determining the timing of the successive pulse repetition periods, and thus determining, for example, the instant $T_0$ (FIG. 3) corresponding to the beginning of a pulse repetition period and/or allowing the above mentioned comparison of the samples with the threshold TH, this preliminary synchronization step, known by the person of ordinary skill in the art, is not necessary.

Figure 17:
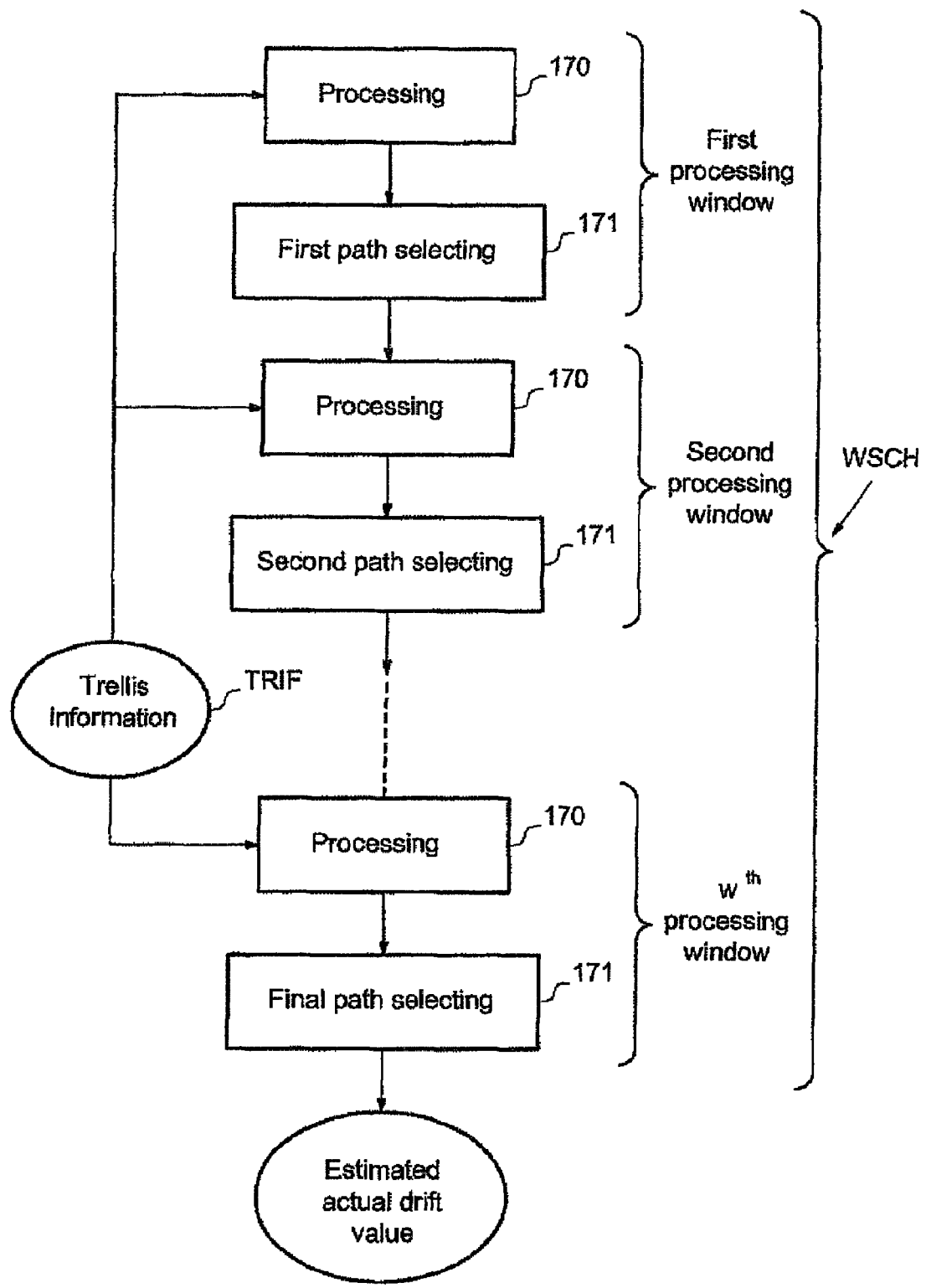
FIG. 17 illustrates diagrammatically another embodiment of a method according to the present invention.

If the drift estimation is done over the entire pulse strain by individually processing each pulse waveform, the final drift estimated may deliver both the index $j_{max}$ corresponding to the finally selected path, but also the index $k_{max}$ corresponding to the strongest sample of the pulse. Thus, such a drift estimation can also be used for performing a coarse synchronization. The memory use may also be reduced by using a windowing scheme for performing the processing step as illustrated diagrammatically in FIG. 17.

More precisely, a windowing scheme WSCH comprising several processing windows is defined. And, the key idea is to keep a finite set of likely drift candidates $\xi k,j(m)$, where $m \leq \lfloor N/N_w \rfloor$, for each window of size $N_w$. Within each processing window, the processing 170 is analogous to the processing which has been described above. And this elementary processing 170 is followed by the first path selected 171. Thus, a part of the memory of the device can be re-used among the sequentially processing windows.

For doing such sequential processing, the control means CLTM is adapted to successively activate the processing means PRM according to the windowing scheme. Management means MGM are adapted to keep the set of likely drift candidates for each processing window. These means can be realized by software or by a specific logic circuit. Simulation results have shown that accurate drift estimation within 0.2-0.8 ppm can be achieved with a Trellis-based implementation in severe multipath scenarios for IEEE 802.15.4a compliant preamble structures. Moreover, the trellis memory can be reduced by over 90% for ±40 ppm crystals at 1 ppm estimation resolution due to a windowing scheme which enables accurate and low-complexity drift estimation. Further, the performance may be independent of the receiver design since the performance is dictated by the detectability of the signal waveform rather than the SNR. Consequently, this embodiment may be implemented in either coherent or non-coherent receivers.

That which is claimed is:

1. A method for estimating drift between a first clock used in a digital transmission processing of a first Ultra Wide Band (UWB) pulse train signal and a second clock used in a digital reception processing of a second UWB pulse train signal resulting from a transmission of the first UWB pulse train signal, the method comprising:
    sampling the second UWB pulse train signal;
    calculating trellis information representative of a trellis comprising reference paths respectively associated to different reference values of the drift and including sample transitions of a sampled third signal based upon the sampled second UWB pulse train signal;
    processing the sampled third signal along the trellis for obtaining a path metric for each processed reference path; and
    selecting the processed reference path having a desired path metric, the drift being the reference value associated to the selected processed reference path.

2. The method according to claim 1 wherein the desired path metric comprises a greatest path metric.

3. The method according to claim 1 wherein the second UWB pulse train signal has a pulse repetition period and each reference path of the trellis includes consecutive nodes spaced by a trellis step corresponding to a time interval greater than or equal to the pulse repetition period and sample transitions of the sampled third signal between consecutive nodes; and wherein the processing comprises:
    selecting, at an initial instant, at least one sample within a pulse repetition period;
    for each selected sample, going trellis step by trellis step over at least one of the reference paths starting from the selected sample; and
    accumulating, for each path, at each node of the path the level of the corresponding sample of the third signal thereby obtaining the path metric.

4. The method according to claim 3 further comprising determining a reference time interval from a sampling period, the pulse repetition period, and a fixed absolute value of the drift between the two clocks; wherein during the reference time interval, no sample transition due to the clock drift can be perceived, the time interval being the reference time interval.

5. The method according to claim 4 further comprising accumulating consecutive sampled pulses of the second UWB pulse train signal during each trellis step for obtaining a train of sampled accumulation pulses timely separated by the reference time interval, the third sampled signal being the train of sampled accumulation pulses.

6. The method according to claim 1 wherein the selecting comprises selecting at least one sample having a level greater than a threshold.

7. The method according to claim 1 wherein the processing is performed according to a windowing scheme and includes keeping, for each window, only a subset of most likely path candidates among the reference paths.

8. The method according to claim 1 wherein the second UWB pulse train signal comprises a preamble including pulses having known characteristics; and wherein the processing is performed over at least a part of the preamble.

9. The method according to claim 1 wherein the first and second UWB pulse train signals each comprise a IEEE 802.15.4a standard UWB pulse train signal.

10. A device for estimating drift between a first clock used in a digital transmission processing a first UWB pulse train signal and a second clock used in a digital reception processing of a second UWB pulse train signal resulting from the transmission of the first UWB pulse train signal, the device comprising:
    a sampler for sampling the second UWB pulse train signal;
    a first memory for storing trellis information representative of a trellis including reference paths respectively associated to different reference values of the drift, the trellis including sample transitions of a sampled third signal based upon the sampled second UWB pulse train signal;
    a processor for processing the third signal along the trellis for obtaining a path metric for each processed reference path; and
    a drift estimator for selecting the processed reference path having a desired path metric, the drift being the reference value associated to the selected processed reference path.

11. The device according to claim 10 wherein the desired path metric comprises a greatest path metric.

12. The device according to claim 10 wherein the second UWB pulse train signal has a pulse repetition period; wherein each reference path includes consecutive nodes spaced by a trellis step corresponding to a time interval greater than or equal to the pulse repetition period, and sample transitions of the sampled third signal between consecutive nodes; further comprising:
    a controller for delivering an initial activation signal at an initial instant;
    said processor processing the third signal along the trellis in response to the initial activation signal;
    said processor including a first selector for selecting at the initial instant at least one sample within a pulse repetition period, and a path metric determiner for each selected sample going trellis step by trellis step over at least some of the reference paths starting from the selected sample, and for each path to accumulate at each node of the path the level of the corresponding sample of the third signal thereby obtaining the path metric.

13. The device according to claim 12 wherein the time interval is a reference time interval, during which no sample transition due to the drift can be perceived, the reference time interval being a function of the sampling period, the pulse repetition period, and a fixed absolute value of the drift between the two clocks.

14. The device according to claim 13 further comprising an accumulator for accumulating consecutive sampled pulses of the second UWB pulse train signal during each trellis step for obtaining a train of sampled accumulation pulses timely separated by the reference time interval; and wherein the third sampled signal is the train of sampled accumulation pulses.

15. The device according to claim 12 wherein said first selector comprises:

a comparer having a first input for receiving a sample and a second input for receiving a threshold; and a selection controller for selecting at least one sample having a level greater than the threshold.

16. The device according to claim 12 wherein said controller is for successively activating said processor according to a windowing scheme and further comprises a manager for keeping, for each window, a subset of most likely path candidates among the reference paths.

17. The device according to claim 10 wherein the second UWB pulse train signal comprises a preamble including pulses having known characteristics; and wherein said processor is for operating over at least a part of the preamble.

18. The device according to claim 10 wherein the first and second UWB pulse train signals each comprise a IEEE 802.15.4a standard UWB pulse train signal.

19. A UWB communication system having an apparatus for estimating drift between a first clock used in a digital transmission processing of a first UWB pulse train signal and a second clock used in a digital reception processing of a second UWB pulse train signal resulting from the transmission of the first UWB pulse train signal, the apparatus comprising:

a sampler for sampling the second UWB pulse train signal;

a first memory for storing trellis information representative of a trellis including reference paths respectively associated to different reference values of the drift, the trellis including sample transitions of a sampled third signal based upon the sampled second UWB pulse train signal;

a processor for processing the third signal along the trellis for obtaining a path metric for each processed reference path; and a drift estimator for selecting the processed reference path having a desired path metric, the drift being the reference value associated to the selected processed reference path.

20. The apparatus according to claim 19 wherein the desired path metric comprises a greatest path metric.

21. The apparatus according to claim 19 wherein the second UWB pulse train signal comprises a preamble including pulses having known characteristics; and wherein said processor is for operating over at least a part of the preamble.

22. The apparatus according to claim 19 wherein the first and second UWB pulse train signals each comprise a IEEE 802.15.4a standard UWB pulse train signal.

* * * * *

UNITED STATES PATENT AND TRADEMARK OFFICE
CERTIFICATE OF CORRECTION

| | | |
|---|---|---|
| PATENT NO. | : 7,916,818 B2 | Page 1 of 1 |
| APPLICATION NO. | : 11/850934 | |
| DATED | : March 29, 2011 | |
| INVENTOR(S) | : Wellig | |

It is certified that error appears in the above-identified patent and that said Letters Patent is hereby corrected as shown below:

Column 4, Line 24   Delete: "aspects"
          Insert: --aspect,--

Column 8, Line 45   Delete: "$M.T_p$"
          Insert: --$M \cdot T_p$--

Column 9, Line 41   Delete: "into"
          Insert: --in--

Column 10, Line 7   Delete: "index"
          Insert: --indexes--

Column 10, Line 13   Delete: "index"
          Insert: --indexes--

Signed and Sealed this
Sixth Day of September, 2011

David J. Kappos
*Director of the United States Patent and Trademark Office*